United States Patent
Yen et al.

(10) Patent No.: US 12,021,013 B2
(45) Date of Patent: Jun. 25, 2024

(54) BALL PAD DESIGN FOR SEMICONDUCTOR PACKAGES

(71) Applicant: MEDIATEK INC., Hsin-Chu (TW)

(72) Inventors: Chiang-Lin Yen, Hsinchu (TW); Che-Hung Kuo, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 273 days.

(21) Appl. No.: 17/547,127

(22) Filed: Dec. 9, 2021

(65) Prior Publication Data

US 2022/0246508 A1 Aug. 4, 2022

Related U.S. Application Data

(60) Provisional application No. 63/143,076, filed on Jan. 29, 2021.

(51) Int. Cl.
*H01L 23/495* (2006.01)
*H01L 23/31* (2006.01)
*H01L 23/498* (2006.01)

(52) U.S. Cl.
CPC .... *H01L 23/49816* (2013.01); *H01L 23/3128* (2013.01); *H01L 23/3171* (2013.01); *H01L 23/49822* (2013.01)

(58) Field of Classification Search
CPC ............. H01L 23/3128; H01L 23/3171; H01L 23/49816; H01L 23/49822
USPC ........................................ 257/737, 786, 773
See application file for complete search history.

(56) References Cited

U.S. PATENT DOCUMENTS

| | | | | |
|---|---|---|---|---|
| 5,757,078 A | * | 5/1998 | Matsuda | H01L 24/13 257/737 |
| 5,814,894 A | * | 9/1998 | Igarashi | H01L 23/49816 257/E23.125 |
| 8,294,264 B2 | * | 10/2012 | Wang | H01L 24/05 257/737 |
| 2005/0212133 A1 | | 9/2005 | Barnak | |
| 2009/0140401 A1 | | 6/2009 | Beddingfield | |
| 2011/0186987 A1 | | 8/2011 | Wang | |
| 2013/0147031 A1 | * | 6/2013 | Chen | H01L 24/11 257/737 |
| 2013/0147033 A1 | | 6/2013 | Chen | |
| 2014/0339712 A1 | * | 11/2014 | Alvarado | H01L 23/3114 257/786 |
| 2016/0322337 A1 | | 11/2016 | Liang | |
| 2017/0271286 A1 | | 9/2017 | Kim | |

(Continued)

FOREIGN PATENT DOCUMENTS

| | | |
|---|---|---|
| TW | 201133737 A1 | 10/2011 |
| TW | 201533813 A | 9/2015 |
| TW | 201712835 A | 4/2017 |

(Continued)

*Primary Examiner* — Nitin Parekh
(74) *Attorney, Agent, or Firm* — Winston Hsu

(57) ABSTRACT

A semiconductor structure includes a semiconductor die having an active surface, a passivation layer covering the active surface of the semiconductor die, and a post-passivation interconnect (PPI) layer disposed over the passivation layer. The PPI layer includes a ball pad having a first diameter. A polymer layer covers a perimeter of the ball pad. An under-bump-metallurgy (UBM) layer is disposed on the ball pad. The UBM layer has a second diameter that is greater than the first diameter of the ball pad. A solder ball is mounted on the UBM layer.

25 Claims, 3 Drawing Sheets

(56) References Cited

U.S. PATENT DOCUMENTS

2019/0229079 A1  7/2019  Pozder

FOREIGN PATENT DOCUMENTS

| TW | 201824464 A | 7/2018 |
| TW | 202101724 A | 1/2021 |

* cited by examiner

BALL PAD DESIGN FOR SEMICONDUCTOR PACKAGES

CROSS REFERENCE TO RELATED APPLICATIONS

This application claims priority from U.S. provisional application No. 63/143,076 filed on Jan. 29, 2021, which is included in its entirety herein by reference.

BACKGROUND

The present disclosure relates generally to the field of semiconductor packaging. More particularly, the present disclosure relates to a semiconductor structure with novel ball pad design for semiconductor packages, in particular, RDL-based packages.

The advance in semiconductor field induces a series of problems and challenges in the signal integrity (SI) and power integrity (PI). Interconnects of package are discontinuities for signal and power transmission, and they are easily affected by many factor such as cross-talk, parasitic coupling, impedance mismatch, simultaneous switching noise (SSN) and electromagnetic interference (EMI).

Impedance control is an important issue in high-speed circuit and system design. Impedance matching challenges RF and microwave circuit design because the window for error decreases as frequency increases. High-speed digital circuits require very stable controlled impedances because of the impact on bit error rate and the potential for pulse distortion, reflection, and EMI.

SUMMARY

One aspect of the invention provides a semiconductor structure including a semiconductor die having an active surface, a passivation layer covering the active surface of the semiconductor die, and a post-passivation interconnect (PPI) layer disposed over the passivation layer. The PPI layer includes a ball pad having a first diameter. A polymer layer covers a perimeter of the ball pad. An under-bump-metallurgy (UBM) layer is disposed on the ball pad. The UBM layer has a second diameter that is greater than the first diameter of the ball pad. A solder ball is mounted on the UBM layer.

According to some embodiments, the passivation layer comprises silicon nitride.

According to some embodiments, the polymer layer comprises epoxy, polyimide, benzocyclobutene (BCB), or polybenzoxazole (PBO).

According to some embodiments, an opening is formed in the polymer layer to expose at least a portion of the ball pad.

According to some embodiments, the UBM layer is disposed within the opening and is in direct contact with the ball pad.

According to some embodiments, the UBM layer comprises an adhesion layer, a barrier layer and a wetting layer.

According to some embodiments, the solder ball is a lead-free ball.

According to some embodiments, the lead-free ball has a composition comprising copper, silver, tin, or combinations thereof.

According to some embodiments, the first diameter ranges between 100~200 micrometers.

According to some embodiments, the first diameter is about 124 micrometers.

According to some embodiments, the second diameter is about 200 micrometers.

According to some embodiments, the solder ball has a third diameter of about 220 micrometers at ball pitch of 0.35 mm.

According to some embodiments, the PPI layer comprises a discontinuous dummy metal ring provided to encircle the ball pad at a distance from a perimeter of the ball pad.

According to some embodiments, the discontinuous dummy metal ring is coplanar with the ball pad.

According to some embodiments, the semiconductor structure further includes a molding compound surrounding the semiconductor die.

Another aspect of the invention provides a semiconductor structure including a semiconductor die having an active surface, a passivation layer covering the active surface of the semiconductor die, a molding compound surrounding the semiconductor die; and a re-distribution layer (RDL) structure disposed over the passivation layer and the molding compound. The RDL structure includes a post-passivation interconnect (PPI) layer comprising a ball pad having a first diameter, a polymer layer covering a perimeter of the ball pad, an under-bump-metallurgy (UBM) layer disposed on the ball pad, and a solder ball mounted on the UBM layer. The UBM layer has a second diameter that is greater than the first diameter of the ball pad.

According to some embodiments, the RDL structure has a thickness less than 10 micrometers.

According to some embodiments, the passivation layer comprises silicon nitride.

According to some embodiments, the polymer layer comprises epoxy, polyimide, benzocyclobutene (BCB), or polybenzoxazole (PBO).

According to some embodiments, an opening is formed in the polymer layer to expose at least a portion of the ball pad.

According to some embodiments, the UBM layer is disposed within the opening and is in direct contact with the ball pad.

According to some embodiments, the first diameter ranges between 100~200 micrometers.

According to some embodiments, the first diameter is about 124 micrometers.

According to some embodiments, the second diameter is about 200 micrometers.

According to some embodiments, the solder ball has a third diameter of about 220 micrometers at ball pitch of 0.35 mm.

According to some embodiments, the PPI layer comprises a discontinuous dummy metal ring provided to encircle the ball pad at a distance from a perimeter of the ball pad.

According to some embodiments, the discontinuous dummy metal ring is coplanar with the ball pad.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
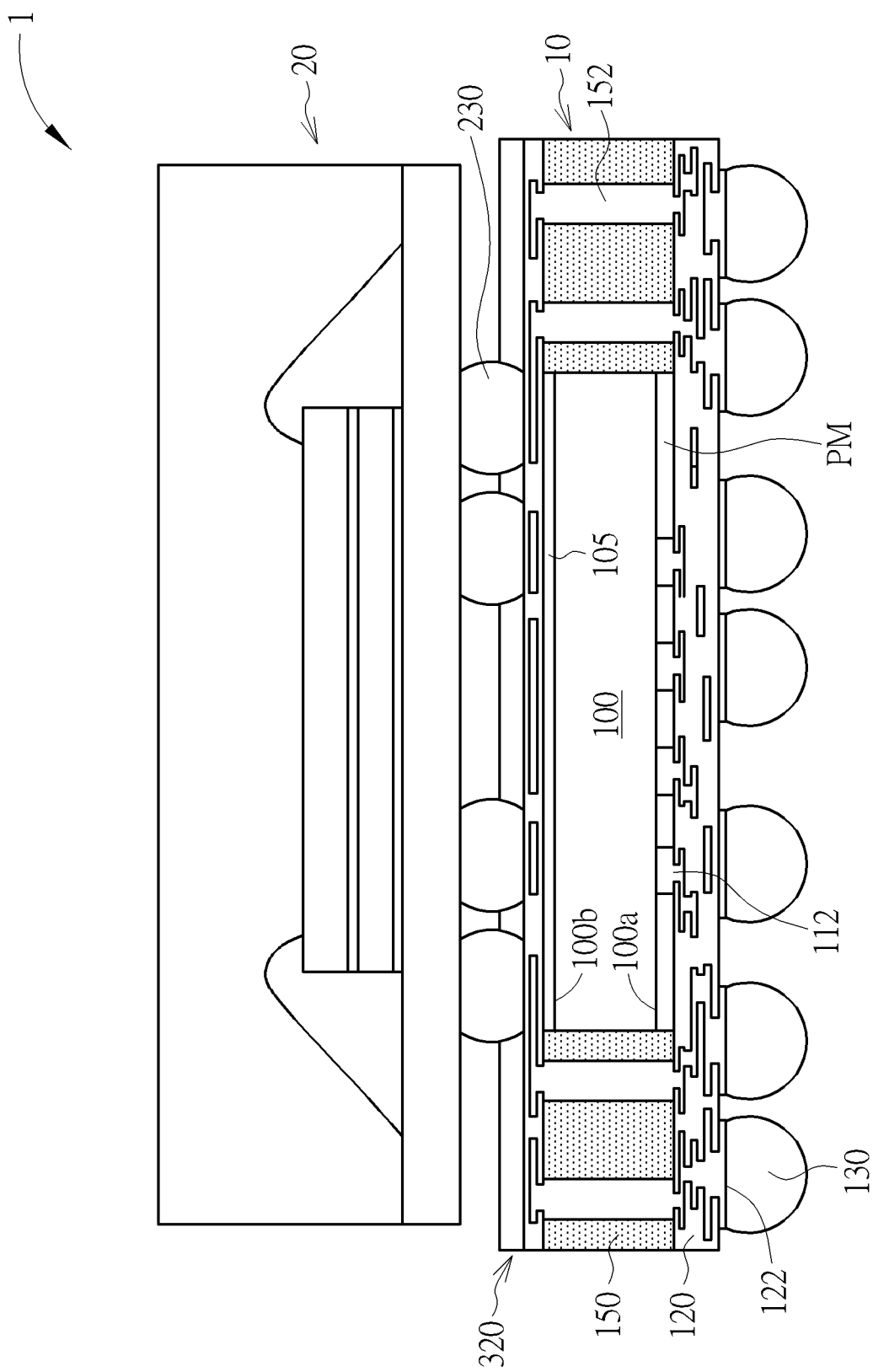
FIG. 1 is a schematic, sectional diagram showing an exemplary semiconductor package according to one embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The present disclosure pertains to a semiconductor structure with a novel ball pad design capable of improving signal impedance control, which is suited for various packaging fields such as flip-chip assembly, wafer-level chip scale package (WLCSP), fan-out type WLCSP package, three-dimensional integrated circuit (3D-IC) stack, and/or any other advanced package technology fields. Fan-out type WLCSP structures enable larger pitches of bumps for the I/O electrical contacts.

High-speed and/or RF chip packages with high power current usually require smaller resistance or inductance (R/L) of package. RDL-based (RDL: re-distribution layer) packages have become a new package candidate due to its thinner dielectric thickness (1-10 μm) than other package substrates that are normally 20~100 μm thick. The thinner thickness of the RDL structure of the RDL-based package means that it can provide shorter power/ground (P/G) path and hence lower R/L.

The impedance drop of a chip package is usually greater on its ball side because the solder ball has bigger cross-section area, which is accompanied by larger parasitic capacitance. However, the impedance drop of the RDL-based packages is even worse on the ball side because of the relatively thinner dielectric layer of the RDL structure. To mitigate the increased impedance drop off the RDL-based packages, a special void design may be employed at the (n−1)th RDL layer under the ball pad at the nth RDL layer. However, to implement such special void design, a more expensive four-layer RDL or interposer substrate is required. In addition, the special void design reduces the flexibility of the RDL circuit routing. The present disclosure addresses these issues.

Please refer to FIG. 1. FIG. 1 is a schematic, sectional diagram showing an exemplary semiconductor package according to one embodiment of the invention. As shown in FIG. 1, for example, the semiconductor package 1 may be a package-on-package (PoP). It is to be understood that the PoP package in FIG. 1 is for illustration purposes only and the disclosed ball pad design may be applied to other RDL-based package types. The semiconductor package 1 comprises a semiconductor die 100 surrounded by a molding compound 150. According to an embodiment of the invention, for example, the molding compound 150 may comprise an epoxy resin. According to an embodiment of the invention, an active surface 100*a* of the semiconductor die 100 may be covered with a protective layer PM. Interconnect features 112 such as micro-bumps or conductive traces may be formed in the protective layer PM for further connection. A lower surface of the molding compound 150 may be flush with a lower surface of the protective layer PM.

According to an embodiment of the invention, a re-distribution layer (RDL) structure 120 is formed on the lower surface of the molding compound 150 and the lower surface of the protective layer PM. According to an embodiment of the invention, the RDL structure 120 may comprise a plurality of PPI layers and a plurality of polymer layers. For example, four PPI layers and five polymer layers are illustrated. According to an embodiment of the invention, a plurality of ball pads 122 is formed in the outermost PPI layer (or the fourth PPI layer in this example). A plurality of solder balls 130 is formed on the plurality of ball pads 122, respectively. According to an embodiment of the invention, the RDL structure 120 may have a thickness less than 10 micrometers. According to an embodiment of the invention, the RDL structure 120 may have a thickness of 1-10 micrometers.

According to an embodiment of the invention, for example, a plurality of through mold vias 152 may be formed in the molding compound 150. A carrier substrate 320 may be provided on the rear surface 100*b* of the semiconductor die 100. The carrier substrate 320 has interconnect or traces that electrically connect the connecting elements 230 of an upper package 20 with the through mold vias 152 and the underlying RDL structure 120. A die attach film 105 may be disposed between the rear surface 100*b* of the semiconductor die 100 and the carrier substrate 320. According to another embodiment of the invention, the carrier substrate 320 may be replaced with a re-distribution layer structure, in that case, the upper RDL structure 320 could be provided on the rear surface 100*b* of the semiconductor die 100, the upper RDL structure 320 has interconnect or traces that electrically connect the connecting elements 230 of an upper package 20 with the through mold vias 152 and the underlying RDL structure 120. A die attach film 105 may be disposed between the rear surface 100*b* of the semiconductor die 100 and the upper RDL structure 320.

Figure 2:
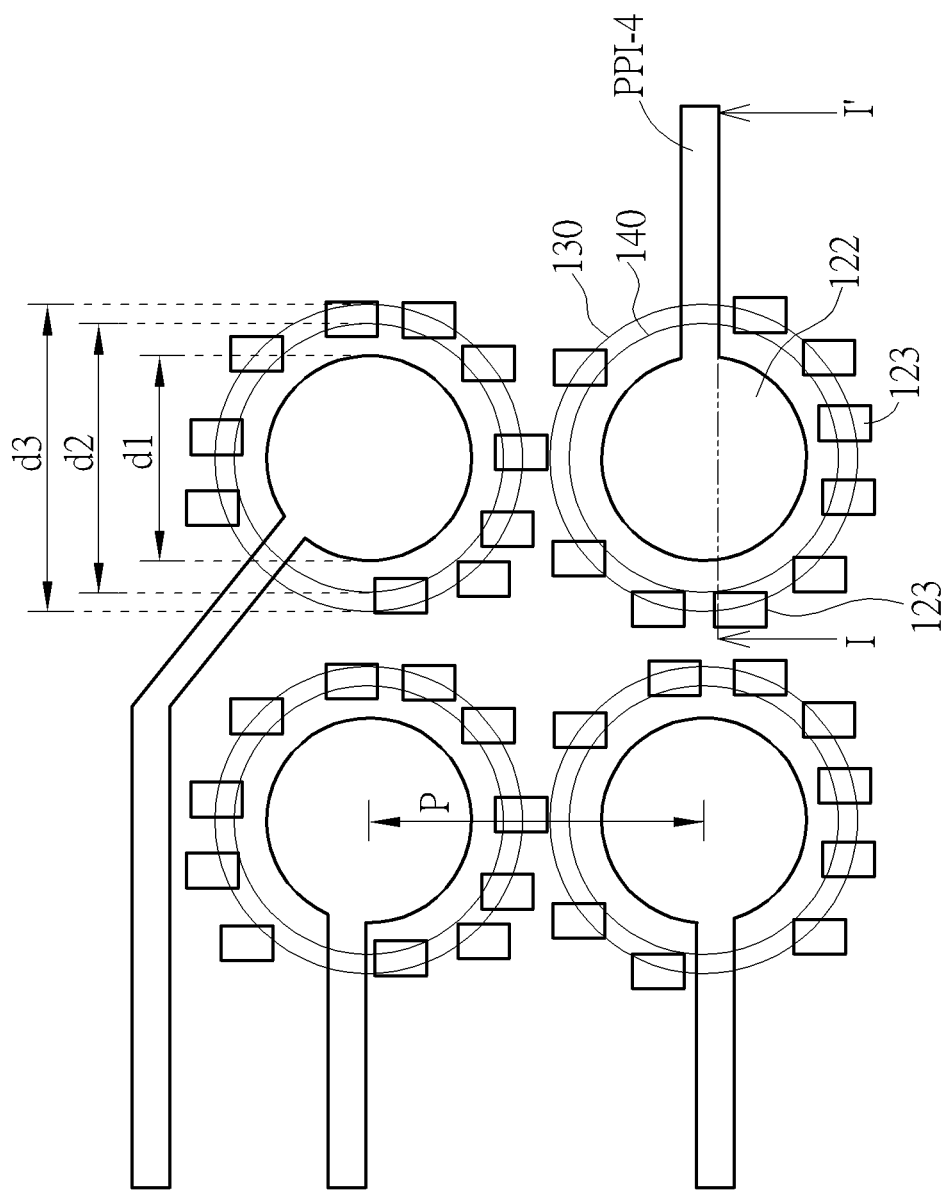
FIG. 2 is a schematic diagram showing a portion of the layout of the ball pads 122 on the ball side of the semiconductor package 1 in FIG. 1.
Figure 3:
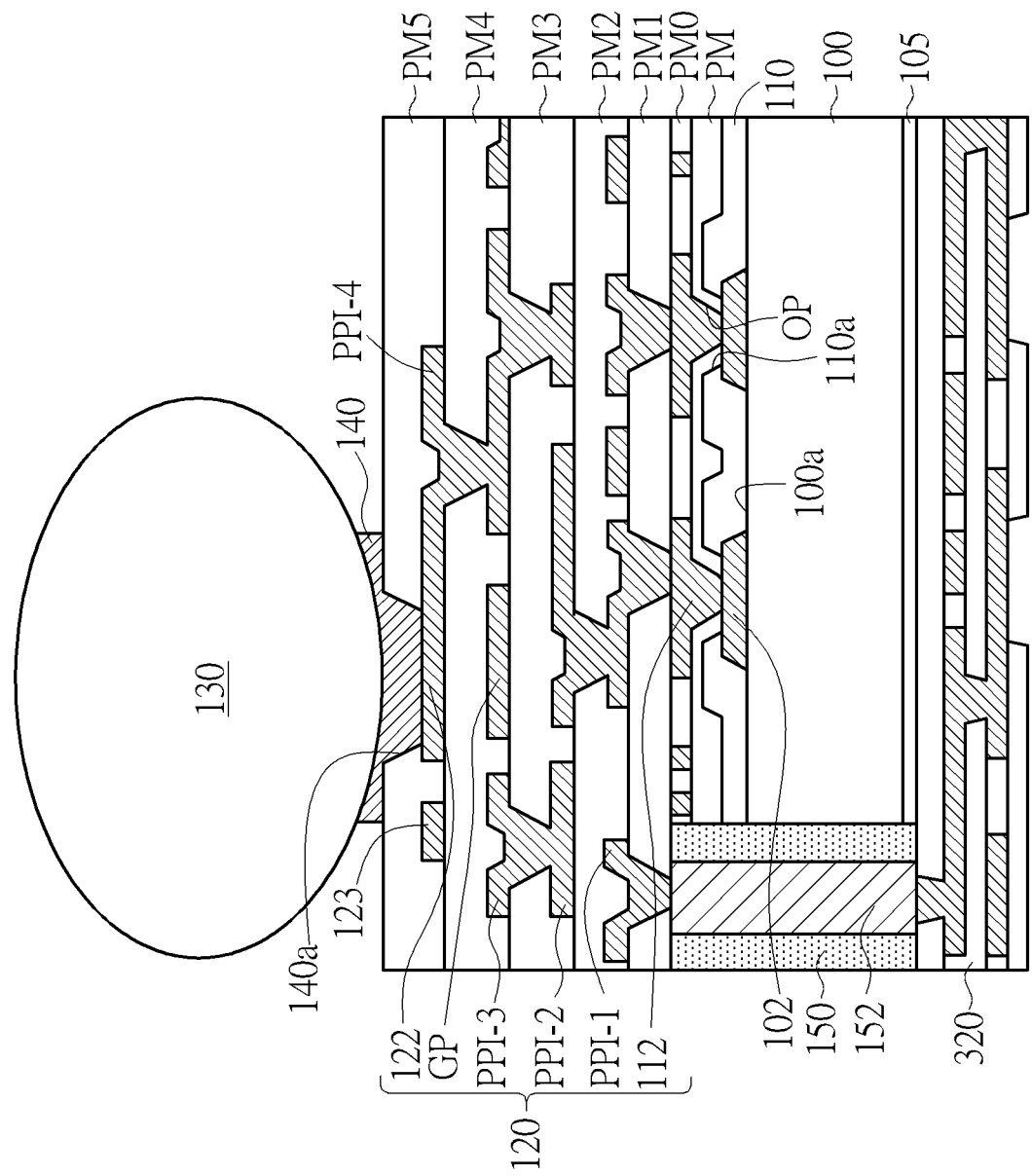
FIG. 3 is a partial, cross-sectional view of the semiconductor package taken along line I-I' in FIG. 2.

Please refer to FIG. 2 and FIG. 3. FIG. 2 is a schematic diagram showing a portion of the layout of the ball pads 122 on the ball side of the semiconductor package 1 in FIG. 1. FIG. 3 is a partial, cross-sectional view of the semiconductor package taken along line I-I' in FIG. 2, wherein like layers, regions or elements are designated by like numeral numbers or labels.

As shown in FIG. 3, a plurality of input/output (I/O) pads 102 may be provided on the active surface 100*a* of the semiconductor die 100. For example, the I/O pads 102 may be aluminum pads, but not limited thereto. In some embodiments, for example, the I/O pads 102 may be a conductive material including, but not limited to, copper (Cu), tungsten (W), gold (Au), silver (Ag), aluminum, (Al), lead (Pb), tin (Sn), alloys thereof. The passivation layer 110 covers the upper surface of the substrate 100 and the perimeter of each I/O pad 102. According to an embodiment, an opening 110a is formed in the passivation layer 110 to expose a central surface region of each I/O pad 102. According to an embodiment, the passivation layer 110 may comprise silicon nitride, silicon oxynitride, or the like.

According to an embodiment of the invention, for example, a protective layer PM and a polymer layer PM0 may be formed on the passivation layer 110. For example, the protective layer PM may be composed of silicon nitride, silicon oxide or other insulating materials. The protective layer PM may be formed via a masking and deposition process, via a deposition and etching process, or the like. According to an embodiment, an opening OP is formed in the protective layer PM and the polymer layer PM0 to expose the central surface region of each I/O pad 102.

According to an embodiment of the invention, the RDL structure 120 is disposed on the protective layer PM and the polymer layer PM0. The RDL structure 120 is electrically connected to the I/O pads 102. For example, the RDL structure 120 may comprise four PPI layers PPI-1~PPI-4 and five polymer layers PM1~PM5. It is understood that the number of the PPI layers and the polymer layers are for illustration purposes only. In some embodiments, for example, the RDL structure 120 may comprise only three PPI layers or more than four PPI layers depending upon the design requirements.

According to an embodiment, for example, each of the PPI layers PPI-1~PPI-4 may comprise a copper (Cu) layer. According to an embodiment, for example, each of the PPI layers PPI-1~PPI-4 may further comprise a titanium (Ti) layer under the copper layer. According to an embodiment, for example, the polymer layers PM1~PM5 may comprise epoxy, polyimide, benzocyclobutene (BCB), or polybenzoxazole (PBO), but not limited thereto. For example, the polymer layers PM1~PM5 may be polyimide layers.

According to an embodiment of the invention, for a four-layer RDL structure as shown in FIG. 3, signal traces such as digital/analog signal traces may be generally disposed in the first and second PPI layers PPI-1~PPI-2, and a ground plane GP may be disposed in the third PPI layer PPI-3. For a three-layer RDL structure, the signal traces such as digital/analog signal traces may be disposed in the first PPI layer and the ground plane may be disposed in the second PPI layer. At least a ball pad 122 is formed in the fourth PPI layer PPI-4. An opening 140a is formed in the fifth polymer layer PM5 to expose a central region of the ball pad 122. According to an embodiment, an under-bump-metallurgy (UBM) layer 140 is disposed within the opening 140a and is in direct contact with the ball pad 122.

According to an embodiment of the invention, a solder ball 130 such as a lead-free ball is formed on the UBM layer 140. For example, the lead-free ball may have a composition comprising copper, silver, tin, or combinations thereof, but is not limited thereto. To form the solder ball 130, a lead-free solder may, for example, be screened onto the UBM layer 140. The lead-free solder may be reflowed at 240-260 degree Celsius for typically 1 to 3 minutes so that the lead-free solder reflows to form the solder ball 130 and react with the UBM layer 140. In some embodiments, the solder ball 130 may be formed by using an electroplating process or a ball mounting process.

The UBM layer 140 may comprise an adhesion layer, a barrier layer and a wetting layer, but not limited thereto. The UBM layer 140 may comprise titanium, titanium nitride, titanium tantalum, titanium tantalum nitride, tungsten, titanium tungsten, nickel, gold, chrome, copper, copper alloy, or any combinations thereof. Any suitable materials or layers of material that may be used for the UBM are fully intended to be included within the scope of the current application.

FIG. 2 shows a perspective view of the concentric layout of the projected circular areas of the solder ball 130, the UBM layer 140 and the underlying ball pad 122. It is understood that the layout of the solder ball and ball pad are not drawn to scale. As shown in FIG. 2, for example, the ball pitch P may be 0.35 mm and the solder ball 130 may have a diameter d3 of about 220 micrometers. According to an embodiment of the invention, the circular-shaped UBM layer 140 may have a diameter d2 of about 200 micrometers. According to an embodiment of the invention, the ball pad 122 may have a diameter d1 of about 100200 micrometers, for example, 124 micrometers. It is one technical feature that the diameter d1 is smaller than both of the diameters d2 and d3."

According to an embodiment of the invention, a discontinuous dummy metal ring 123 is provided to encircle the ball pad 122 at a distance from the perimeter of the ball pad 122 in the fourth PPI layer PPI-4. As shown in FIG. 3, the discontinuous dummy metal ring 123 is coplanar with the ball pad 122. The discontinuous dummy metal ring 123 helps to release high stress that typically concentrates on the polymer layer around an edge of the PPI layer, thereby preventing cracking defects. According to another embodiment, the dummy metal ring 123 may be a continuous metal ring and may be electrically connected to ground.

It is advantageous to use the present invention because by shrinking the diameter d1 of the ball pad 122, the impedance control can be improved for the RDL-based package. According to the experimental results, the impedance at the ball side of the RDL-based package can be increased from 67 ohm to 87 ohm. Therefore, the signal integrity of the RDL-based package can be improved. Further, since the void circuit design under the ball pad is spared, the routing flexibility of the RDL structure is increased and the cost of the package can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a semiconductor die having an active surface;
a passivation layer covering the active surface of the semiconductor die;
a post-passivation interconnect (PPI) layer disposed over the passivation layer, wherein the PPI layer comprises a ball pad having a first diameter;
a polymer layer covering a perimeter of the ball pad;
an under-bump-metallurgy (UBM) layer disposed on the ball pad, wherein the UBM layer has a second diameter that is greater than the first diameter of the ball pad, wherein the PPI layer comprises a discontinuous dummy metal ring provided to encircle the ball pad at a distance from a perimeter of the ball pad, and wherein the discontinuous dummy metal ring partially overlaps with the UBM layer when viewed from above; and
a solder ball mounted on the UBM layer.

2. The semiconductor structure according to claim 1, wherein the passivation layer comprises silicon nitride.

3. The semiconductor structure according to claim 1, wherein the polymer layer comprises epoxy, polyimide, benzocyclobutene (BCB), or polybenzoxazole (PBO).

4. The semiconductor structure according to claim 1, wherein an opening is formed in the polymer layer to expose at least a portion of the ball pad.

5. The semiconductor structure according to claim 4, wherein the UBM layer is disposed within the opening and is in direct contact with the ball pad.

6. The semiconductor structure according to claim 1, wherein the UBM layer comprises an adhesion layer, a barrier layer and a wetting layer.

7. The semiconductor structure according to claim 1, wherein the solder ball is a lead-free ball.

8. The semiconductor structure according to claim 7, wherein the lead-free ball has a composition comprising copper, silver, tin, or combinations thereof.

9. The semiconductor structure according to claim 1, wherein the first diameter ranges between 100200 micrometers.

10. The semiconductor structure according to claim 1, wherein the first diameter is about 124 micrometers.

11. The semiconductor structure according to claim 1, wherein the second diameter is about 200 micrometers.

12. The semiconductor structure according to claim 1, wherein the solder ball has a third diameter of about 220 micrometers at ball pitch of 0.35 mm.

13. The semiconductor structure according to claim 1, wherein the discontinuous dummy metal ring is coplanar with the ball pad.

14. The semiconductor structure according to claim 1 further comprising:
a molding compound surrounding the semiconductor die.

15. A semiconductor structure, comprising:
a semiconductor die having an active surface;
a passivation layer covering the active surface of the semiconductor die;
a molding compound surrounding the semiconductor die; and
a re-distribution layer (RDL) structure disposed over the passivation layer and the molding compound, wherein the RDL structure comprises a post-passivation interconnect (PPI) layer comprising a ball pad having a first diameter, a polymer layer covering a perimeter of the ball pad, an under-bump-metallurgy (UBM) layer disposed on the ball pad, and a solder ball mounted on the UBM layer, wherein the UBM layer has a second diameter that is greater than the first diameter of the ball pad, wherein the PPI layer comprises a discontinuous dummy metal ring provided to encircle the ball pad at a distance from a perimeter of the ball pad, and wherein the discontinuous dummy metal ring partially overlaps with the UBM layer when viewed from above.

16. The semiconductor structure according to claim 15, wherein the RDL structure has a thickness less than 10 micrometers.

17. The semiconductor structure according to claim 15, wherein the passivation layer comprises silicon nitride.

18. The semiconductor structure according to claim 15, wherein the polymer layer comprises epoxy, polyimide, benzocyclobutene (BCB), or polybenzoxazole (PBO).

19. The semiconductor structure according to claim 15, wherein an opening is formed in the polymer layer to expose at least a portion of the ball pad.

20. The semiconductor structure according to claim 19, wherein the UBM layer is disposed within the opening and is in direct contact with the ball pad.

21. The semiconductor structure according to claim 15, wherein the first diameter ranges between 100200 micrometers.

22. The semiconductor structure according to claim 15, wherein the first diameter is about 124 micrometers.

23. The semiconductor structure according to claim 15, wherein the second diameter is about 200 micrometers.

24. The semiconductor structure according to claim 15, wherein the solder ball has a third diameter of about 220 micrometers at ball pitch of 0.35 mm.

25. The semiconductor structure according to claim 15, wherein the discontinuous dummy metal ring is coplanar with the ball pad.

* * * * *